(12) United States Patent
Sharma et al.

(10) Patent No.: US 10,811,461 B2
(45) Date of Patent: Oct. 20, 2020

(54) ACCESS TRANSMISSION GATE

(71) Applicant: Intel Corporation, Santa Clara, CA (US)

(72) Inventors: Abhishek A. Sharma, Hillsboro, OR (US); Ravi Pillarisetty, Portland, OR (US); Van H. Le, Beaverton, OR (US); Gilbert W. Dewey, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/461,334

(22) PCT Filed: Dec. 30, 2016

(86) PCT No.: PCT/US2016/069358
§ 371 (c)(1),
(2) Date: May 15, 2019

(87) PCT Pub. No.: WO2018/125174
PCT Pub. Date: Jul. 5, 2018

(65) Prior Publication Data
US 2020/0058705 A1    Feb. 20, 2020

(51) Int. Cl.
*H01L 27/24* (2006.01)
*H01L 21/8238* (2006.01)
*H01L 25/065* (2006.01)
*H01L 27/092* (2006.01)

(52) U.S. Cl.
CPC .. *H01L 27/2436* (2013.01); *H01L 21/823828* (2013.01); *H01L 21/823857* (2013.01); *H01L 25/0657* (2013.01); *H01L 27/0922* (2013.01)

(58) Field of Classification Search
CPC .................................................. H01L 27/2436
USPC ................................................................ 257/5
See application file for complete search history.

(56) References Cited

U.S. PATENT DOCUMENTS

| | | | |
|---|---|---|---|
| 2006/0114030 A1* | 6/2006 | Yang | G11C 8/14 326/101 |
| 2010/0315176 A1 | 12/2010 | Kao et al. | |
| 2014/0264554 A1 | 9/2014 | Lim et al. | |
| 2015/0140741 A1 | 5/2015 | Sze et al. | |
| 2015/0243497 A1 | 8/2015 | Haensch et al. | |

(Continued)

FOREIGN PATENT DOCUMENTS

WO    2018125174 A1    7/2018

OTHER PUBLICATIONS

International Search Report and Written Opinion issued in PCT Application No. PCT/US2016/069358 dated Sep. 21, 2017; 10 pages.

*Primary Examiner* — Ajay Arora
(74) *Attorney, Agent, or Firm* — Patent Capital Group

(57) ABSTRACT

Substrates, assemblies, and techniques for a transmission gate that includes an n-type back end transistor and a p-type back end transistor in parallel with the n-type back end transistor. The transmission gate can be on a non-silicon substrate and include a second gate, a p-type semiconducting layer over the second gate, an n-type semiconducting layer over the p-type semiconducting layer, a bit line over the n-type semiconducting layer, a first gate over the n-type semiconducting layer, and a source line over the n-type semiconducting layer. The transmission gate may be coupled to a memory element.

18 Claims, 10 Drawing Sheets

(56) References Cited

U.S. PATENT DOCUMENTS

2015/0364556 A1* 12/2015 Rodder ............... H01L 29/4238
257/392

* cited by examiner

ACCESS TRANSMISSION GATE

CROSS-REFERENCE TO RELATED APPLICATION

This application is a national stage application under 35 U.S.C. § 371 of PCT International Application Serial No. PCT/US2016/069358 filed on Dec. 30, 2016 and entitled "ACCESS TRANSMISSION GATE," which is hereby incorporated by reference herein in its entirety.

TECHNICAL FIELD

The present disclosure relates generally to the field of memory cells, and more particularly, to an access transmission gate for a memory cell.

BACKGROUND

Most, if not all, logic devices require some type of memory cell such as random access memory. Resistive random access memory (RRAM or ReRAM) is a type of non-volatile (NV) random-access computer memory that works by changing the resistance across a dielectric solid-state material. RRAM can be similar to a memristor which is a hypothetical, non-linear, passive two-terminal electrical component relating electric charge and magnetic flux linkage. The memristor's electrical resistance is not constant but depends on the history of current that had previously flowed through the device. A RRAM cell is a device that remembers its history so when the electric power supply is turned off, the RRAM cell remembers its most recent resistance until it is turned on again. Using this property, the RRAM cell can be used as a memory cell or memory array for electronic devices. The cell transistors of the RRAM are usually engineered to a high Vt to be reliable at a high bias. However, the fixed Vt of the transistor results in a low drive strength for the memory cell.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

Figure 1:
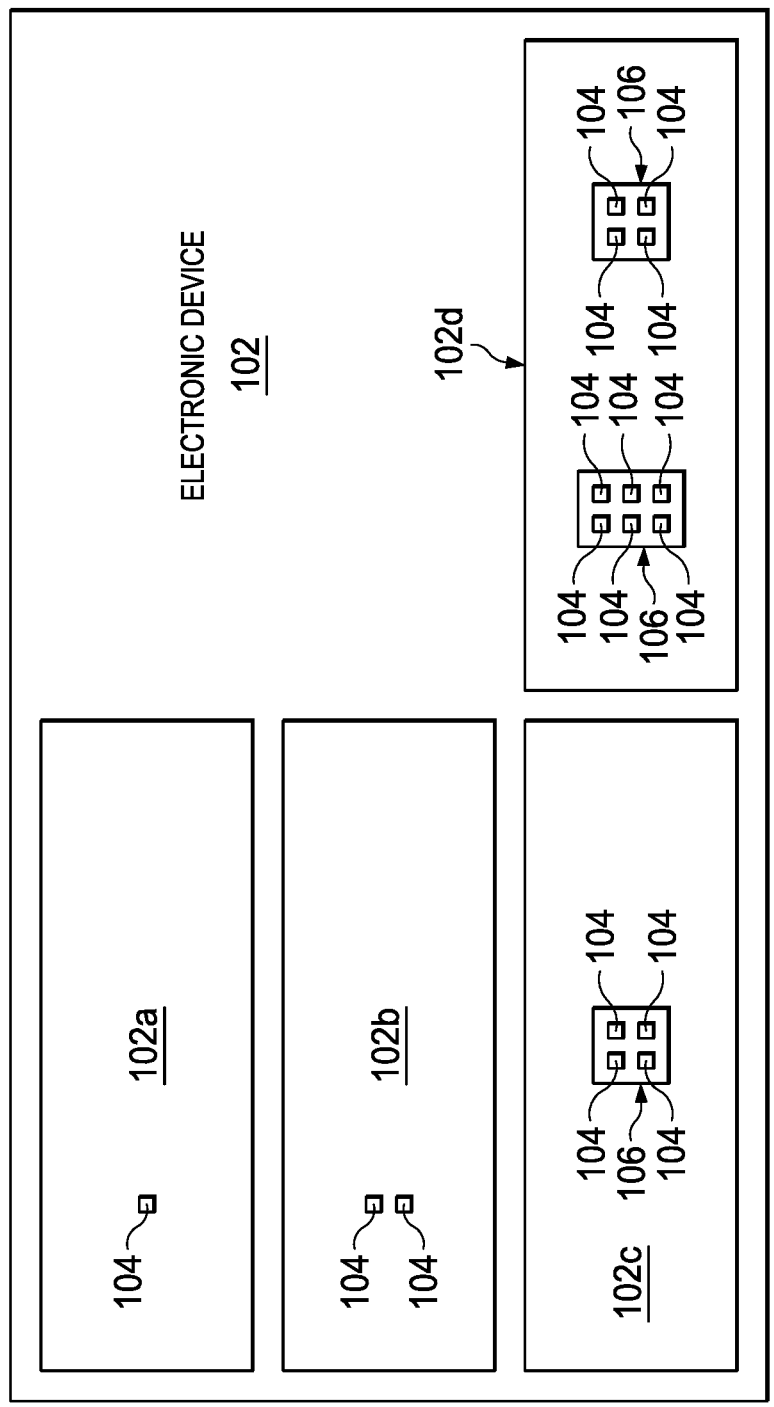
FIG. 1 is a simplified block diagram illustrating an embodiment of a portion of an electronic device, in accordance with one embodiment of the present disclosure.

The figures of the drawings are not necessarily drawn to scale, as their dimensions can be varied considerably without departing from the scope of the present disclosure.

DETAILED DESCRIPTION

The following detailed description sets forth example embodiments of apparatuses, methods, and systems relating to an access transmission gate. Features such as structure(s), function(s), and/or characteristic(s), for example, are described with reference to one embodiment as a matter of convenience; various embodiments may be implemented with any suitable one or more of the described features.

In the following description, various aspects of the illustrative implementations will be described using terms commonly employed by those skilled in the art to convey the substance of their work to others skilled in the art. However, it will be apparent to those skilled in the art that the embodiments disclosed herein may be practiced with only some of the described aspects. For purposes of explanation, specific numbers, materials and configurations are set forth in order to provide a thorough understanding of the illustrative implementations. However, it will be apparent to one skilled in the art that the embodiments disclosed herein may be practiced without the specific details. In other instances, well-known features are omitted or simplified in order not to obscure the illustrative implementations.

Disclosed herein are substrates, assemblies, and techniques for enabling a device that includes one or more access transmission gates. The access transmission gate can include a n-type back end transistor in parallel with a p-type back end transistor. The access transmission gate can be on top of a support substrate such as a non-silicon substrate. In an implementation, the substrate may be a semiconductor substrate.

The terms "over," "under," "below," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

Implementations of the embodiments disclosed herein may be formed or carried out on a substrate, such as a non-semiconductor substrate or a semiconductor substrate. In one implementation, the non-semiconductor substrate may be silicon dioxide, inter-layer dielectric composed of silicon dioxide, silicon nitride, titanium oxide and other transition metal oxides. Although a few examples of materials from which the non-semiconducting substrate may be formed are described here, any material that may serve as a foundation upon which a non-semiconductor device may be built falls within the spirit and scope of the embodiments disclosed herein.

In another implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. In other examples, the substrate may be a flexible substrate including 2D materials such as graphene and molybdenum disulphide, organic materials such as pentacene, transparent oxides such as indium gallium zinc oxide poly/amorphous (low temperature of dep) III-V semiconductors and germanium/silicon, and other non-silicon flexible substrates. Although a few examples of materials from which the substrate may be formed are described here, any material that may serve as a foundation upon which a semiconductor device may be built falls within the spirit and scope of the embodiments disclosed herein.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. As used herein, the terms "chip" and "die" may be used interchangeably.

FIG. 1 is a simplified block diagram of an electronic device 100 that includes one or more access transmission gates and arrays in accordance with an embodiment of the present disclosure. Electronic device 100 can be any electronic device that includes memory (e.g., computer, smartphone, laptop, desktop, Internet-of-Things (IoT) device, vehicle, handheld electronic device, personal digital assistant, wearable, etc.). Electronic device 100 can include one or more electronic elements 102a-102d. Each electronic element 102a-102d can include one or more transmission gates 104 and/or one or more transmission gate arrays 106. Each transistor array 106 can be a systematic arrangement of a plurality of transmission gates 104, (e.g., in rows and columns). Each transmission gate 104 can be configured as an access transmission gate with both a NMOS back end transistor and a PMOS back end transistor. Transmission gate 104 can be a transistor or an electronic switch that can be either in an "on" or "off" state and the term "transistor" includes a bipolar junction transistor (BJT), filed effect transistor (FET), finFET, junction gate FET (JFET), insulated gate FET (IGFET), metal-oxide-semiconductor field-effect transistors (MOSFET), n-channel field effect transistor (NFET) insulated-gate bipolar transistor, or other similar transistor that can be configured to perform the functions, features, and operations disclosed herein. Transmission gate 104 can be coupled to a memory element such as RRAM.

RRAM (or ReRAM) is a type of non-volatile (NV) random-access computer memory that works by changing the resistance across a dielectric solid-state material. The cell transistors of the RRAM are typically engineered to a high Vt to be reliable at a high bias. However, the fixed Vt of the transistor results in a low drive strength in either SET or RESET operations of the RRAM due to the source follower condition in one of the polarities. The low drive strength can limit the switching currents used to operate the RRAM and result in low reliability of the RRAM cell and RRAM cell array.

Currently, transistor ballasts are used to limit the total current through a one transistor one resistor (1T1R) RRAM cell. A 1T1R RRAM cell is a form of electronic NV memory (eNVM). A typical NMOS array used in RRAM causes source degeneration where the transistors are unable to provide enough current because the resistive switch has a high resistance value that causes the drain to source voltage to be reduced and causes the transistor to go into a linear region of operation. This problem is often exacerbated due to wafer to wafer and die to die variability. Moreover, current transistors are in the frontend (i.e., on silicon), taking up significant area on a device with limited space. With current transistors, the gate voltage (Vg) has the same polarity for both SET and RESET operations and there is source degeneration in one switching direction. Because of the source degeneration, a 1T1R cell switching current is significantly suppressed in one polarity.

Transmission gate 104 can be configured to resolve these issues (and others). For example, transmission gate 104 can be configured to include a transmission gate that contains both an NMOS back end transistor and a PMOS back end transistor in parallel. Transmission gate 104 can be used as a ballast in series with another electronic device such as a resistive switching device or memory cell (e.g., RRAM). This allows for a relatively large resistance ratio with the two resistors (the NMOS back end transistor and the PMOS back end transistor) in parallel to allow for a relatively high current in both directions (both polarities) of the transmission gate. Transmission gate 104 may be is stacked on top of logic or some other device or element.

In a specific example, the transmission gate can include a P-type thin film on a substrate that may or may not be silicon. When a negative bias is applied to the NMOS gate and a positive voltage to the PMOS gate, transmission gate 104 can be almost completely turned off with a wide band gap and very little current flowing between the gates. Because silicon is not being used, transmission gate may be on an oxide layer and not on silicon (e.g., not on the wafer, package, chip or die).

Figure 2:
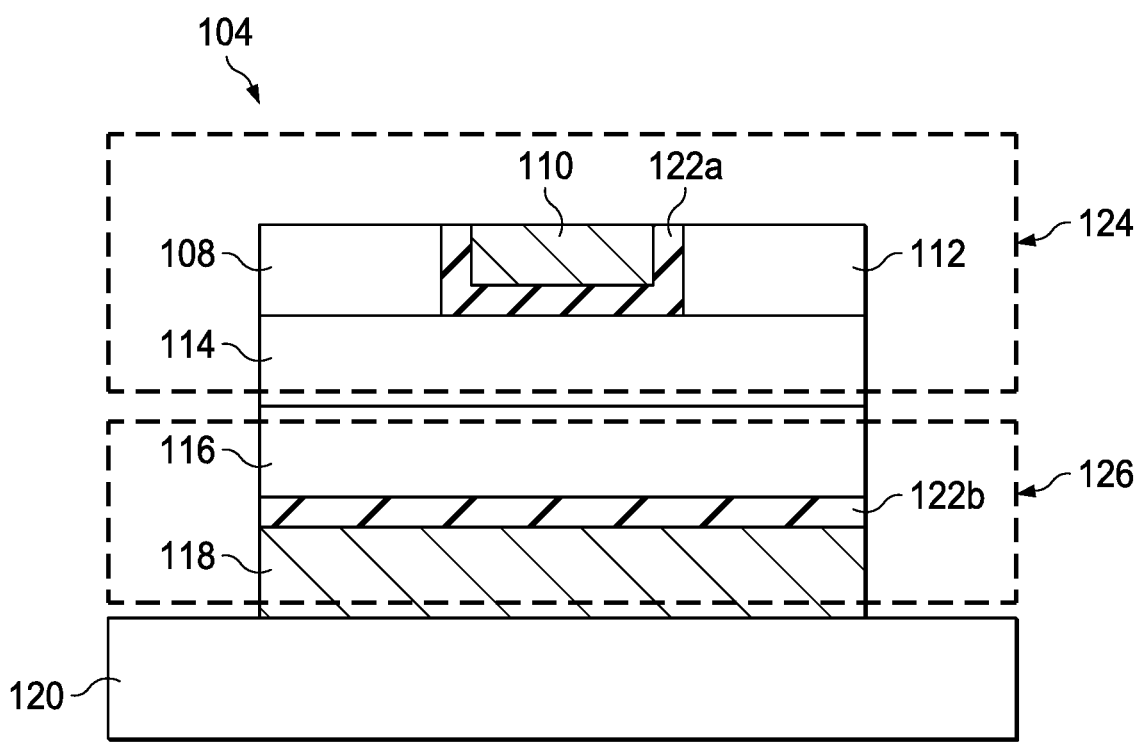
FIG. 2 is a simplified block diagram illustrating an embodiment of a portion of an electronic device, in accordance with one embodiment of the present disclosure.

Turning to FIG. 2, FIG. 2 illustrates one embodiment of transmission gate 104. Transmission gate 104 can be configured as a back end access transmission gate on a non-silicon layer. Transmission gate 104 can include a bit line 108, a first gate 110, a source line 112, an n-type semiconducting layer 114, a p-type semiconducting layer 116, a second gate 118, a substrate 120, and dielectric 122a and 122b. In an example, dielectric 122a and 122b are the same or similar material. In another example, dielectric 122a and 122b are different materials.

Bit line 108, first gate 110, source line 112, and n-type semiconducting layer 114 can be configured as a n-type back end transistor 124. Bit line 108, source line 112, p-type semiconducting layer 116 and second gate 118 can be configured as a p-type back end transistor 126. Bit line 108 and source line 112 are configured to act as a common source and drain for n-type back end transistor 124 and p-type back end transistor 126.

Bit line 108 can be configured as a bit line or a source. Bit line 108 can be composed of layers or bi-layers of tungsten, cobalt, titanium nitride, tantalum nitride, aluminum, ITO, tantalum, ruthenium, hafnium, and other similar materials. First gate 110 can be configured as a word line or gate for n-type back end transistor 124. First gate 110 can be composed of layers or bi-layers of tungsten, cobalt, titanium nitride, tantalum nitride, titanium, aluminum, indium tin oxide, tantalum, ruthenium, hafnium, and other similar materials.

Source line 112 can be configured as a source or drain. Source line 112 can be composed of layers or bi-layers of tungsten, cobalt, titanium nitride, tantalum nitride, titanium, aluminum, indium tin oxide, tantalum, ruthenium, hafnium, and other similar materials. N-type semiconducting layer 114 can be an N-type thin film semiconductor. N-type semiconducting layer 114 can be composed of semiconducting oxides such as indium gallium zinc oxide, tin oxide, zinc oxide, titanium oxide, etc., chalcogenides such as germanium telluride (where x can be from 0.1 to 8), molybdenum disulfide, black-phosphorous, thin film semiconductors such as n-doped silicon, indium gallium arsenide, germanium, etc. P-type semiconducting layer 116 can be an P-type thin film semiconductor. P-type semiconducting layer 116 can be composed of cobalt oxide, tin oxide, p-doped chalcogenides, black phosphorous and other semiconductors, tungsten diselenide, etc. Second gate 118 can be configured as a word line or gate for p-type back end transistor 126. Second gate 118 can be composed of layers or bi-layers of tungsten, cobalt, titanium nitride, tantalum nitride, titanium, aluminum, indium tin oxide, tantalum, ruthenium, hafnium, and other similar materials. Substrate 120 can be a non-silicon substrate. Substrate can be composed of layers or bi-layers of tungsten, cobalt, titanium nitride, tantalum nitride, titanium, aluminum, indium tin oxide, tantalum, ruthenium, hafnium, and other similar materials. Because substrate 120 is can be a non-silicon substrate, the silicon area of a wafer, package, chip, die, etc. can be saved for high performance computing such as logic or devices that perform computations.

When a current is applied to first gate 110, current flows from bit line 108 to source line 112. When a current is applied to second gate 118, current flows from source line 112 to bit line 108. Source line 112 and first gate 110 may each be configured as a word line. N-type back end transistor 124 (e.g., NMOS back end transistor) and P-type back end transistor 126 (e.g., PMOS back end transistor) are in parallel and allow for a relatively high current in both directions (both polarities) of the transmission gate. This enables the transistor to provide sufficient current in the ON state to switch the device because it helps to prevent source degeneration. The presence of n-type back end transistor 124 in parallel with p-type back end transistor 126 enables the PMOS to provide sufficient voltage to transmission gate 104 which consequently sources current when transmission gate 104 SETs (transition from high to low resistance states) or RESETs (transition from low to high resistance states).

Figure 3:
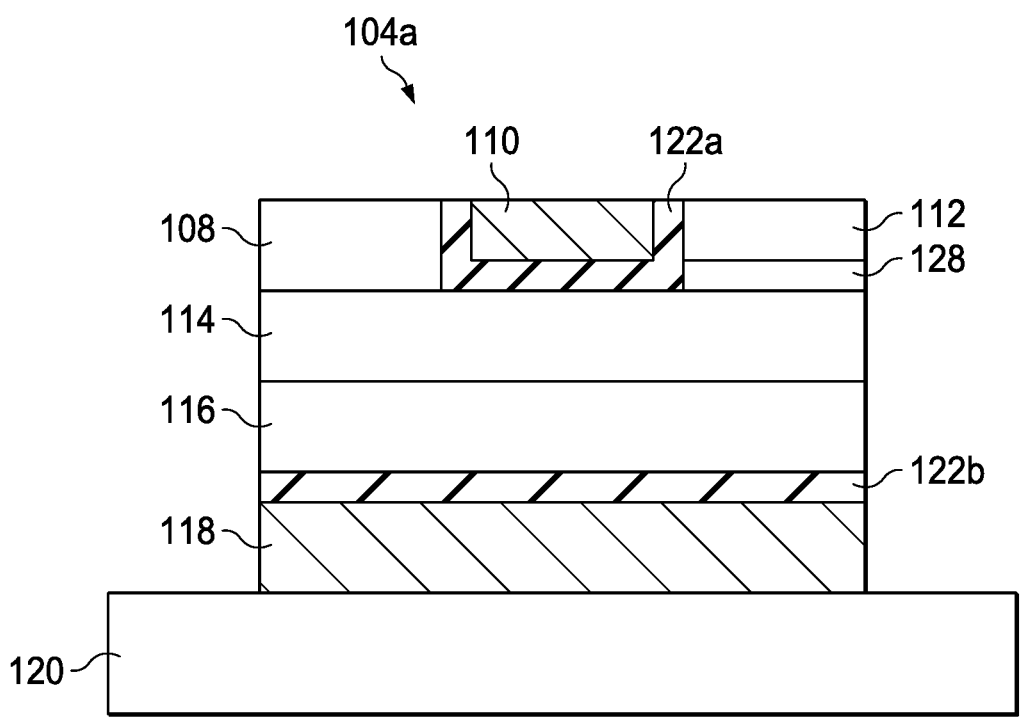
FIG. 3 is a simplified block diagram illustrating an embodiment of a portion of an electronic device, in accordance with one embodiment of the present disclosure.

Turning to FIG. 3, FIG. 3 illustrates one embodiment of transmission gate 104a. In a specific implementation, transmission gate 104a can include a memory element 128. Memory element 128 may be RAM, RRAM, magnetoresistive RAM (MRAM), phase change memory, or some other type of resistive memory.

Figure 4:
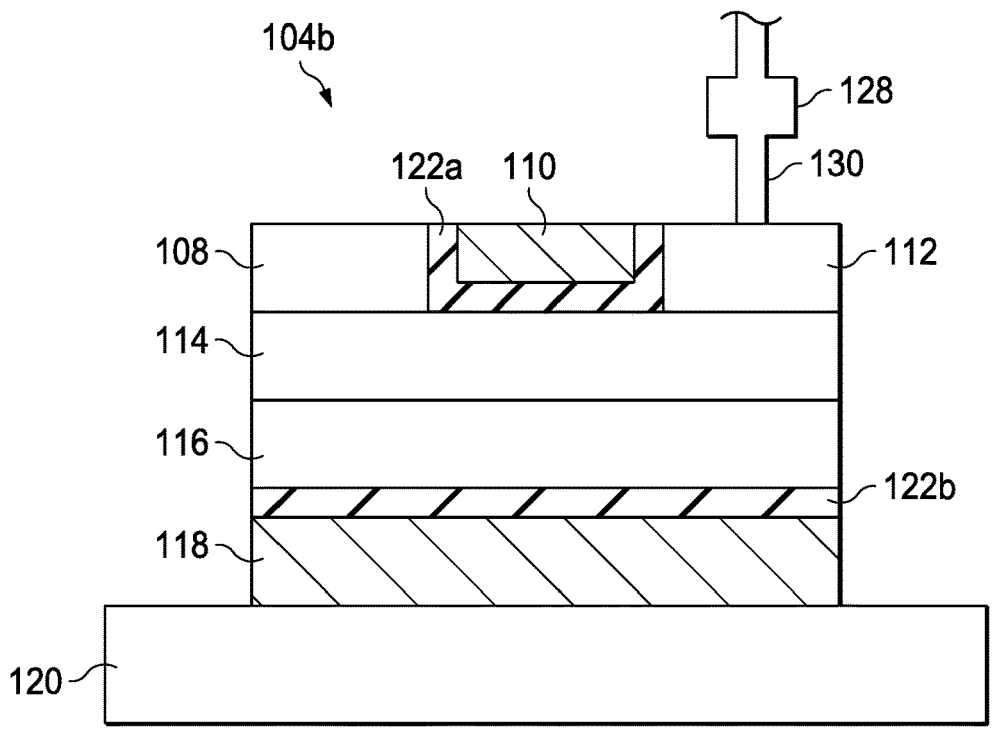
FIG. 4 is a simplified block diagram illustrating an embodiment of a portion of an electronic device, in accordance with one embodiment of the present disclosure.

Turning to FIG. 4, FIG. 4 illustrates one embodiment of transmission gate 104b. In an example, transmission gate 104b can include memory element 128 and connection 130. Connection 130 can be metal connections for transmission gate 104 and may be a metal connection from memory element 128 to source line 112. Connection 130 can be part of a metal-2 or metal-3 extended connection.

Transmission gate 104 can be configured to allow access to memory element 128 and change the resistance of memory element 128. For example, transmission gate 104 can be configured to program memory element 128, deselect or not disturb memory element 128, read memory element 128, etc. In one implementation, memory element 128 can acquire a resistance by applying a bias running a current through bit line 108 and memory element 128. Typically, a bi-polar RRAM is used where a positive bias turns on the RRAM (i.e., a SET) and a negative bias turns off the RRAM (i.e., a RESET). To bias transmission gate 104, an electrical connection can be coupled to bit line 108, first gate 110, source line 112, and.

In order to bias transmission gate 104 and SET memory element 128, or turn memory element 128 from an "off state" to an "on state," a positive bias needs to be applied to memory element 128. To achieve this, a positive voltage on bit line 108 can be biased positively with a high voltage first gate 110 has to be biased positive and source line 112 does not see any bias or would be biased to zero. In this example, the gate to source voltage (Vgs) would turn on transmission gate 104 based on the difference between the voltages on source line 112 and first gate 110. In this biasing condition, memory element 128 does not interfere and the voltage to turn on transmission gate 104 is the voltage on source line 112 and first gate 110. Once transmission gate 104 is turned on, its resistance is lowered significantly and most of the voltage applied to bit line 108 will be used by memory element 128. By enabling transmission gate 104 to turn on with a low Vgs, the configuration of transmission gate 104 helps ensure that memory element 128 sees most of the applied voltage to successfully program memory element 128 or cause memory element 128 to change its resistance.

To turn the resistance off from a low resistance to a high resistance, a high voltage on the negative polarity can be provided. For example, bit line 108 can be biased positively with a high voltage, second gate 118 has to be biased positive and source line 112 does not see any bias or would be biased to zero. In this example, the Vgs would turn off transmission gate 104 based on the difference between the voltages on source line 112 and second gate 118. In this biasing condition, memory element 128 does not interfere and the voltage to turn off transmission gate 104 is the voltage on source line 112 and second gate 118. Once transmission gate 104 is turned off, its resistance is increased significantly and most of the voltage applied to bit line 108 will be used by memory element 128. By enabling transmission gate 104 to turn off with a low Vgs, the configuration of transmission gate 104 helps ensure that memory element 128 sees most of the applied voltage to successfully program memory element 128 or cause memory element 128 to change its resistance.

In a conventional or traditional transistor, one problem or issue is that, for the transistor to turn on, the voltage from the Vgs is typically greater than the threshold voltage of the transistor. The Vgs voltage is influenced by the voltage at the source, the voltage at the gate and the effective source voltage which is on the bit line. An issue arises because the RRAM is in between the source and the gate and so the RRAM would significantly eat up the budget for the voltage to turn on the transistor which creates a source depletion or source following issue. This results in the need to apply a much higher voltage on the gate just to be able to turn on the transistor. The transistor needs to be turned on because once the transistor is turned on, it ensures that all the applied voltage would fall on the RRAM to ensure that the RRAM can successfully make the transition to the off state.

Transmission gate 104 can be configured to circumvent the source follower problem. N-type back end transistor 124 can be used to provide a high voltage and positive polarity to turn on memory element 128 or perform a SET operation. P-type back end transistor 126 can be used to provide a high voltage on the negative polarity to turn off memory element 128 or perform a RESET operation. This can help address the source follower problem and a relatively higher voltage does not need to be provided to effectively account for the voltage drop on the transistor as well as the RRAM.

For example, for the positive bias programing from a high resistance to a low resistance, a bias can be applied to first gate 110 to turn it on and a zero bias can be applied to source line 112. This provides the gate Vgs as the voltage between first gate 110 to source line 112 and there is no memory element 128 between first gate 110 to source line 112. As a result, there are not source follower problems as with current transistors and the bias is on bit line 108. Effectively, transmission gate 104 can be turned on with a low resistance and all the bias that is applied is on bit line 108 and memory element 128. This allows for a successful transition from high resistance to low resistance using a relatively low voltage.

In the reverse polarity side, when the reverse polarity is applied and transmission gate 104 is switched to a positive bias on source line 112, a zero bias on bit line 108, and a positive bias on second gate 118. This allows for a successful transition from low resistance to high resistance using a relatively low voltage. As a result, the voltage drop can be much smaller than a conventional transistor and the voltage can be applied to memory element 128 and allow for a successful transaction.

During the SET operation, source line 112 is in reverse bias and as a result, has a relatively high first junction resistance. However, when the bias of transmission gate 104 reverses for RESET, source line 112 is under positive bias. Transmission gate 104 can be configured such that the resistance of source line 112 can be significantly reduced to a relatively low second junction resistance and allow the current to flow through the drain/bulk junction during RESET. In a specific illustrative example, source line 112 can be configured to allow about 100 uA current at a relatively low bias (e.g., about 0.2V) and allow for low voltage switching for memory element 128. This means that the resistance of source line 112 can be in the range of about one (1) to about four (4) Kohm for a relatively low second junction resistance when transmission gate 104 is in a positive bias (e.g., source line 112 is under a positive bias) and greater than twenty (20) Kohm for a relatively high first junction resistance when transmission gate 104 is in a negative or reverse bias (e.g., drain junction is under a negative or reverse bias).

Figure 5:
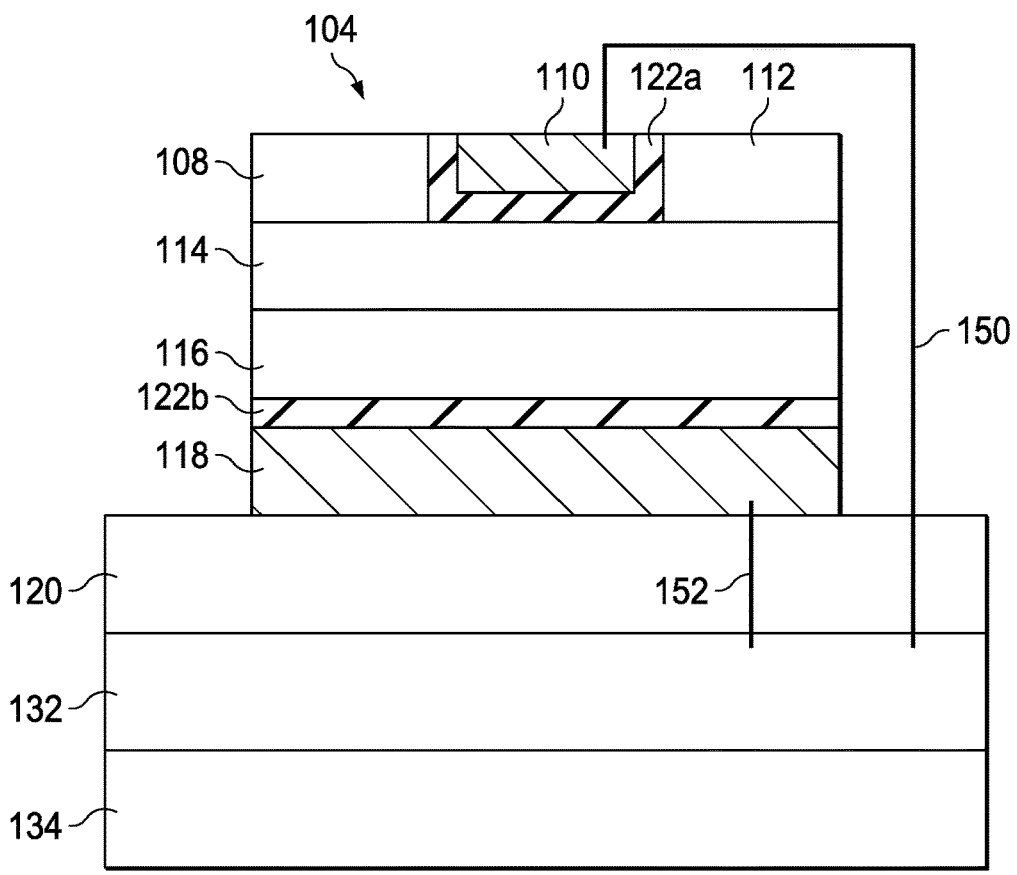
FIG. 5 is a simplified block diagram illustrating an embodiment of a portion of an electronic device, in accordance with one embodiment of the present disclosure.

Turning to FIG. 5, FIG. 5 illustrate one embodiment of transmission gate 104. Transmission gate 104 can be over a silicon-based element such as logic circuitry. For example, transmission gate 104 can be over logic portion 132. Logic portion 132 can be on or over silicon-based substrate 134. Logic portion 132 can be in communication with transmission gate 104 through substrate 120. Logic portion 132 can include transistors, logic (e.g., adders, registers, etc.), microprocessor circuits for processing data and other circuitry. Logic portion 132 can communicate with transmission gate 104 using first gate communication path 150 and second gate communication path 152. In an example, logic portion 132 can communicate with memory element 128 through transmission gate 104 and cause data to be stored in one or more memory elements 128.

Scaling of logic devices is typically accomplished by reducing the size of the logic device. One approach is based on increasing the number of logic elements per unit area. To increase the number of logic elements per unit area, the density of dies needs to be increased and additional logic devices need to be fabricated above the silicon. To increase the density of dies in an integrated circuit (IC) package of a particular footprint, one or more transmission gates 104 may be stacked on top of each other such that instead of fabricating transmission gate 104 on silicon-based substrate 134, transmission gate 104 can be fabricated above silicon-based substrate 134.

The semiconductor substrate for silicon-based substrate 134 (and any additional silicon-based layers) may be formed using alternate materials, which may or may not be combined with silicon. This includes, but is not limited to, silicon, silicon germanium, germanium, indium antimonide, lead telluride, indium arsenide, indium phosphide, gallium arsenide, indium gallium arsenide, gallium antimonide, or other combinations of group III-V or group IV materials. In other examples, the substrate of any layer may be a flexible substrate including 2D materials such as graphene and molybdenum disulfide, organic materials such as pentacene, transparent oxides such as indium gallium zinc oxide poly/amorphous (low temperature of dep) III-V semiconductors and germanium/silicon, and other non-silicon flexible substrates.

In an example, a plurality of electrical components can include one or more transmission gates 104 and/or one or more arrays 106 of transmission gates 104. In addition, a plurality of transistors, such as MOSFET or simply MOS transistors), can include one or more transmission gates 104 and may be fabricated on silicon-based substrate 134. In various embodiments, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that various embodiments may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within silicon based substrate 134 adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide, carbon doped oxide, silicon nitride, organic polymers such as perfluorocyclobutane or polytetrafluoroethylene, fluorosilicate glass, and organosilicates such as silsesquioxane, siloxane, or organosilicate glass. The ILD layers may include pores or air gaps to further reduce their dielectric constant.

Figure 6A:
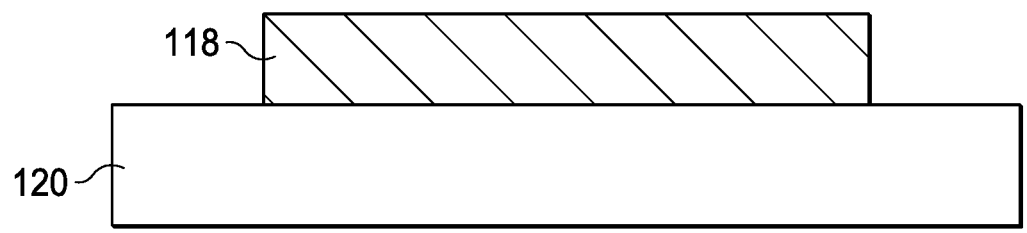
FIG. 6A is a simplified block diagram illustrating an embodiment of a portion of an electronic device, in accordance with one embodiment of the present disclosure.

Turning to FIG. 6A, FIG. 6A illustrates a simplified block diagram of an early stage in the formation of transmission gate 104 in accordance with an embodiment of the present disclosure. As illustrated in FIG. 6A, second gate 118 can be deposited on a substrate 120. Second gate 118 may be deposited using a spin-on deposition from slurry, sputtering, chemical vapor deposition (CVD), or any combination, or some other form of deposition that can deposit second gate 118 on substrate 120. Second gate 118 may be about three (3) nanometers to about twenty (20) nanometers in thickness.

Figure 6B:
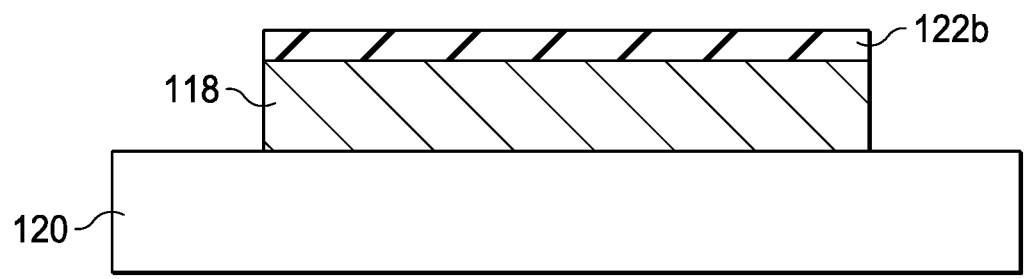
FIG. 6B is a simplified block diagram illustrating an embodiment of a portion of an electronic device, in accordance with one embodiment of the present disclosure.

Turning to FIG. 6B, FIG. 6B illustrates a simplified block diagram of an early stage in the formation of transmission gate 104 in accordance with an embodiment of the present disclosure. Dielectric 122b can be deposited on second gate 118. Dielectric 122b may be deposited using a spin-on deposition from slurry, sputtering, CVD, or any combination, or some other form of deposition that can deposit dielectric 122b on second gate 118. Dielectric 122b can be comprised of a material with a high K dielectric such as Hafnium(IV) oxide, SiO2, etc. Dielectric 122b may be about one (1) nanometer to about five (5) nanometers in thickness.

Figure 6C:
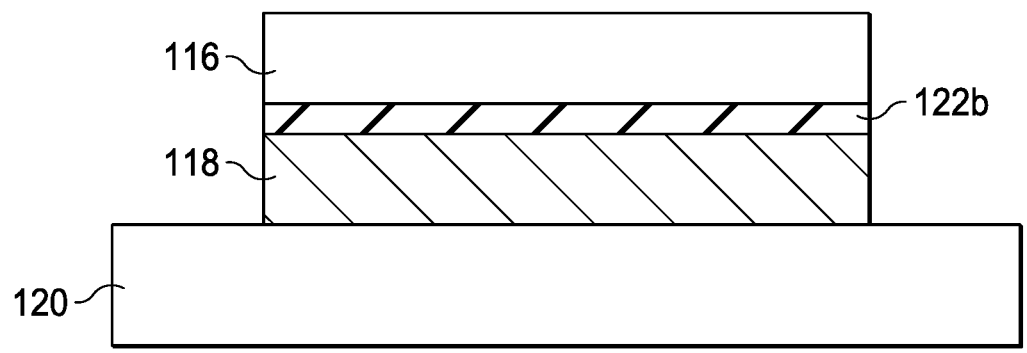
FIG. 6C is a simplified block diagram illustrating an embodiment of a portion of an electronic device, in accordance with one embodiment of the present disclosure.

Turning to FIG. 6C, FIG. 6C illustrates a simplified block diagram of an early stage in the formation of transmission gate 104 in accordance with an embodiment of the present disclosure. As illustrated in FIG. 6C, p-type semiconducting layer 116 can be deposited on dielectric 122b. P-type semiconducting layer 116 may be deposited using a spin-on deposition from slurry, sputtering, CVD, or any combination, or some other form of deposition that can deposit p-type semiconducting layer 116 on dielectric 122b. P-type semiconducting layer 116 may be about 3 nanometers to about 20 nanometers in thickness.

Figure 6D:
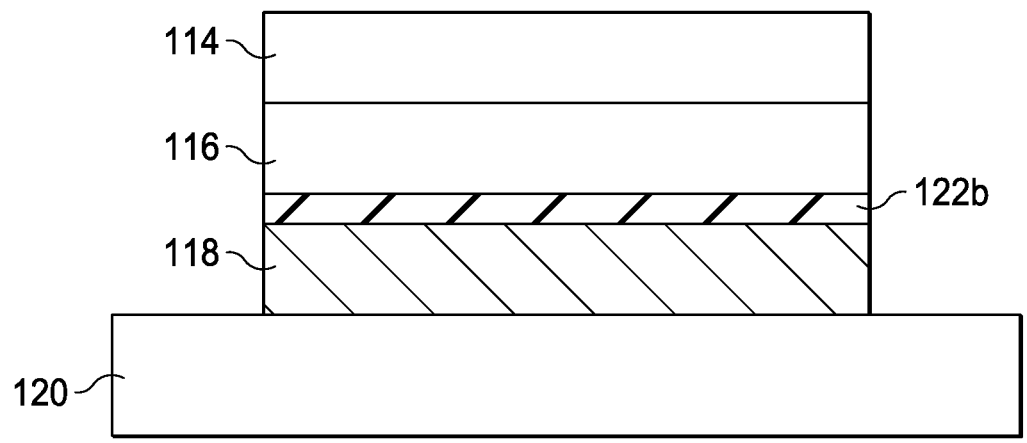
FIG. 6D is a simplified block diagram illustrating an embodiment of a portion of an electronic device, in accordance with one embodiment of the present disclosure.

Turning to FIG. 6D, FIG. 6D illustrates a simplified block diagram of a stage in the formation of transmission gate 104 in accordance with an embodiment of the present disclosure. As illustrated in FIG. 6C, n-type semiconducting layer 114 can be deposited on p-type semiconducting layer 116. N-type semiconducting layer 114 may be deposited using a spin-on deposition from slurry, sputtering, CVD, or any combination, or some other form of deposition that can deposit n-type semiconducting layer 114 on p-type semiconducting layer 116. N-type semiconducting layer 114 may be about 3 nanometers to about 20 nanometers in thickness.

Figure 6E:
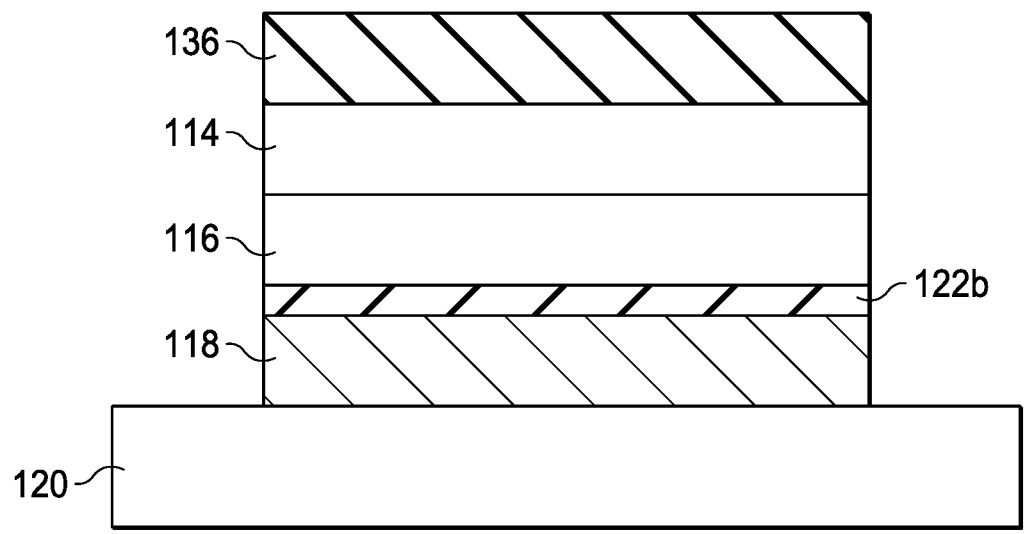
FIG. 6E is a simplified block diagram illustrating an embodiment of a portion of an electronic device, in accordance with one embodiment of the present disclosure.

Turning to FIG. 6E, FIG. 6E illustrates a simplified block diagram of a stage in the formation of transmission gate 104 in accordance with an embodiment of the present disclosure. As illustrated in FIG. 6E, a layer of silicon dioxide layer 136 can be deposited on n-type semiconducting layer 114. Silicon dioxide layer 136 may be deposited using a spin-on deposition from slurry, sputtering, CVD, or any combination, or some other form of deposition that can deposit silicon dioxide layer 136 on n-type semiconducting layer 114. Silicon dioxide layer 136 may be about may be about 3 nanometers to about 20 nanometers in thickness.

Figure 6F:
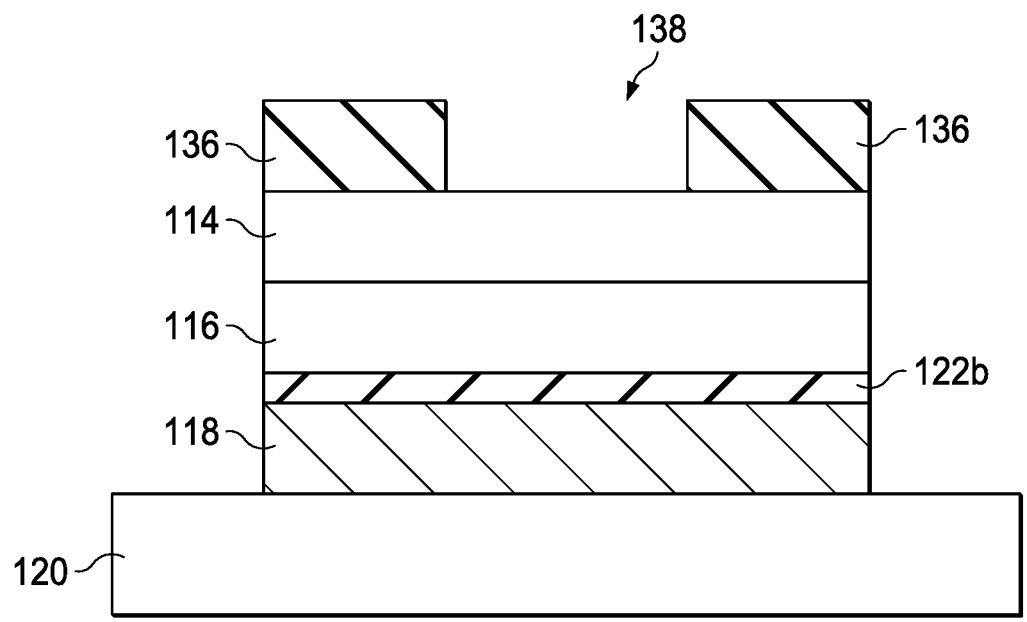
FIG. 6F is a simplified block diagram illustrating an embodiment of a portion of an electronic device, in accordance with one embodiment of the present disclosure.

Turning to FIG. 6F, FIG. 6f illustrates a simplified block diagram of a stage in the formation of transmission gate 104 in accordance with an embodiment of the present disclosure. As illustrated in FIG. 6F, silicon dioxide layer 136 can be etched to create a recess 138. Recess 138 can extend down to n-type semiconducting layer 114.

Figure 6G:
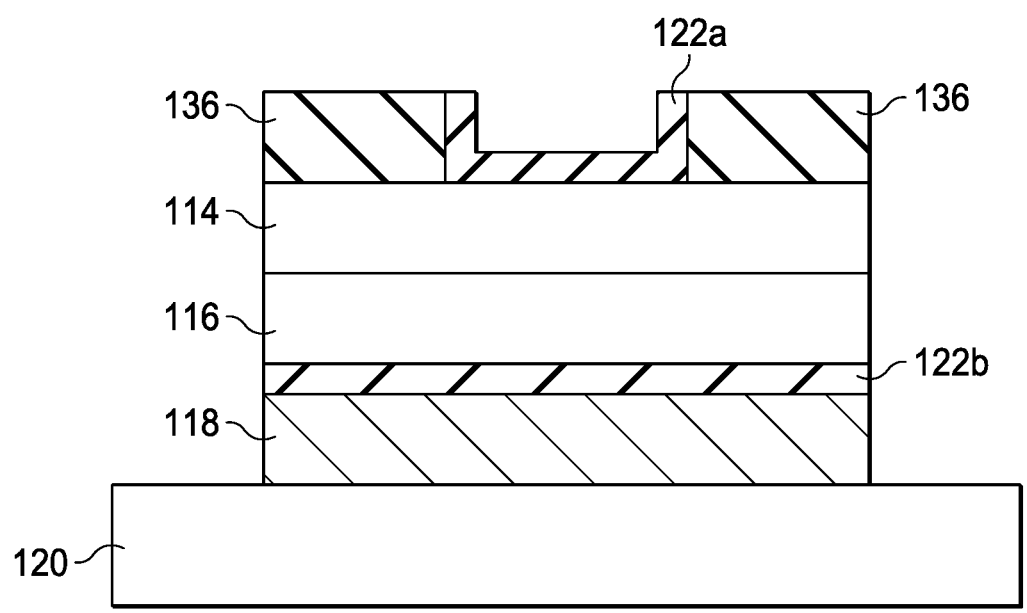
FIG. 6G is a simplified block diagram illustrating an embodiment of a portion of an electronic device, in accordance with one embodiment of the present disclosure.

Turning to FIG. 6G, FIG. 6G illustrates a simplified block diagram of a stage in the formation of transmission gate 104 in accordance with an embodiment of the present disclosure. As illustrated in FIG. 6G, dielectric 122a can be deposited in recess 138. Dielectric 122a may be deposited using a spin-on deposition from slurry, sputtering, CVD, or any combination, or some other form of deposition that can deposit dielectric 122a on n-type semiconducting layer 114. Dielectric 122a may be an oxide layer and/or a gate dielectric. Dielectric 122a can be comprised of a material with a high K dielectric such as Hafnium(IV) oxide, SiO2, etc. Dielectric 122a may be about 1 nanometer to about 5 nanometers in thickness.

Figure 6H:
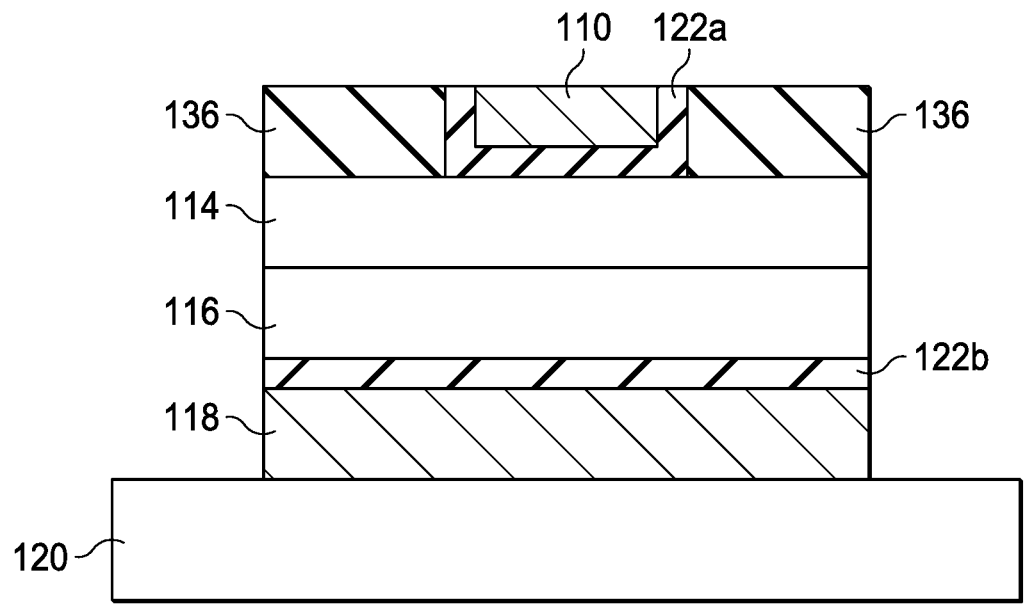
FIG. 6H is a simplified block diagram illustrating an embodiment of a portion of an electronic device, in accordance with one embodiment of the present disclosure.

Turning to FIG. 6H, FIG. 6H illustrates a simplified block diagram of a stage in the formation of transmission gate 104 in accordance with an embodiment of the present disclosure. As illustrated in FIG. 6H, a metal can be deposited (in recess 138) over dielectric 122a to create first gate 110. First gate 110 may be deposited using a spin-on deposition from slurry, sputtering, CVD, or any combination, or some other form of deposition that can deposit first gate 110 on dielectric 122a. First gate 110 may be a metal gate. First gate 110 can be etched and polished.

Figure 6I:
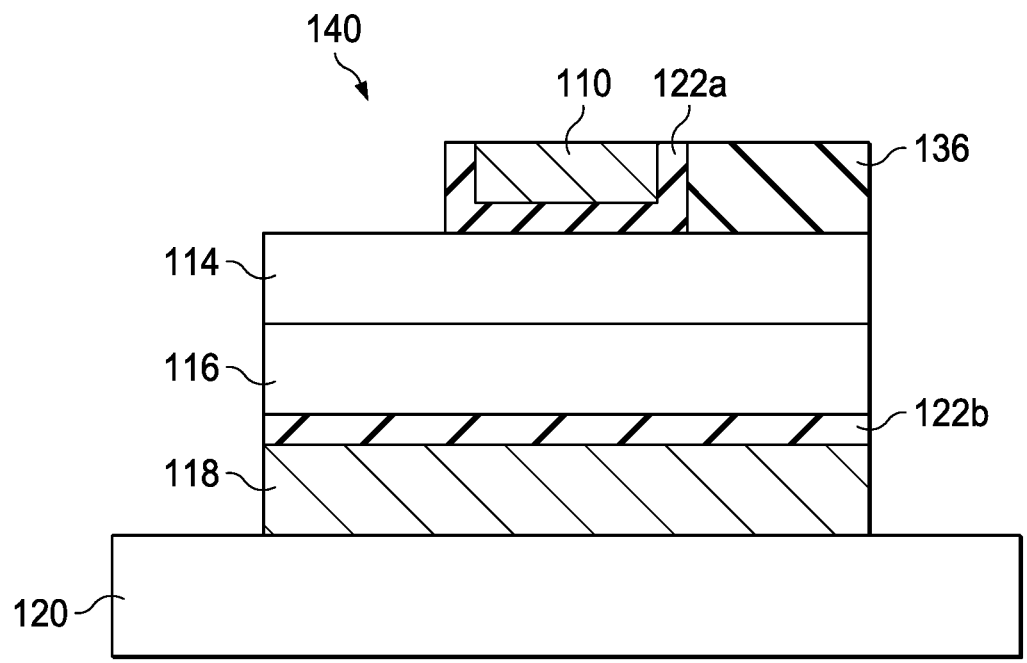
FIG. 6I is a simplified block diagram illustrating an embodiment of a portion of an electronic device, in accordance with one embodiment of the present disclosure.

Turning to FIG. 6I, FIG. 6I illustrates a simplified block diagram of a stage in the formation of transmission gate 104 in accordance with an embodiment of the present disclosure. As illustrated in FIG. 6I, silicon dioxide layer 136 can be etched to create a bit line recess 140. Bit line recess 140 can extend down to n-type semiconducting layer 114.

Figure 6J:
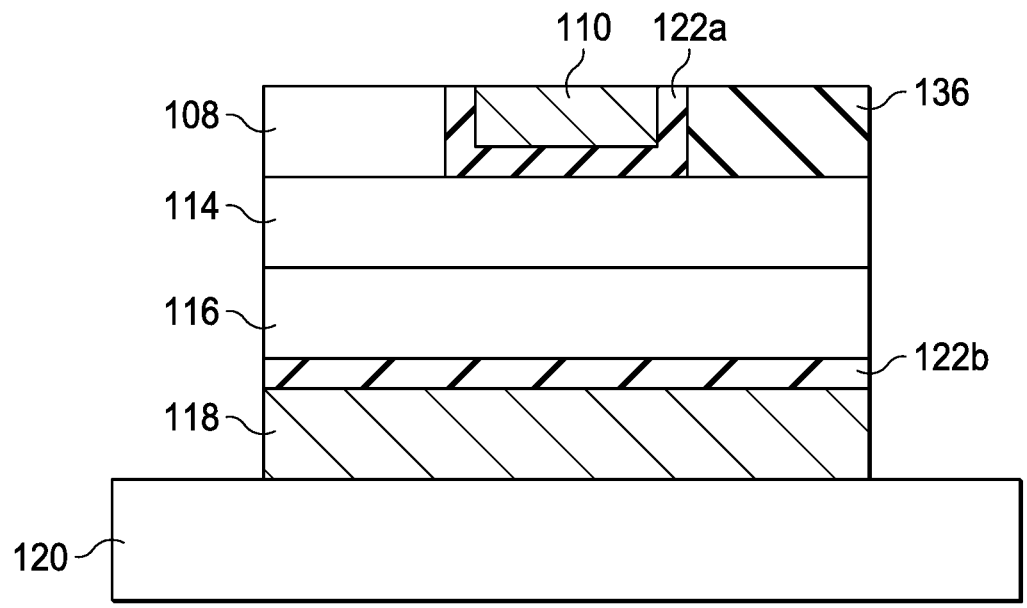
FIG. 6J is a simplified block diagram illustrating an embodiment of a portion of an electronic device, in accordance with one embodiment of the present disclosure.

Turning to FIG. 6J, FIG. 6J illustrates a simplified block diagram of a stage in the formation of transmission gate 104 in accordance with an embodiment of the present disclosure. As illustrated in FIG. 6I, bit line 108 can be deposited in bit line recess 140. Bit line 108 may be deposited using a spin-on deposition from slurry, sputtering, CVD, or any combination, or some other form of deposition that can deposit bit line 108 on n-type semiconducting layer 114.

Figure 6K:
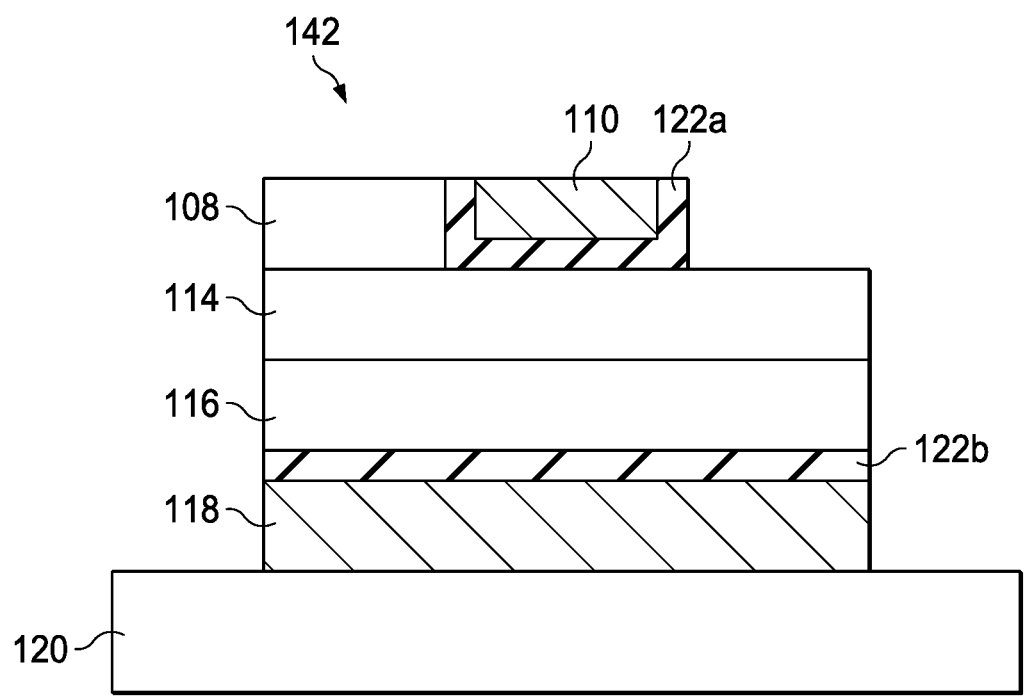
FIG. 6K is a simplified block diagram illustrating an embodiment of a portion of an electronic device, in accordance with one embodiment of the present disclosure.

Turning to FIG. 6K, FIG. 6K illustrates a simplified block diagram of a stage in the formation of transmission gate 104 in accordance with an embodiment of the present disclosure. As illustrated in FIG. 6K, silicon dioxide layer 136 can be etched to create a source line recess 142. Source line recess 142 can extend down to n-type semiconducting layer 114. Source line 112 can be deposited in source line recess 142 to create transmission gate 104 illustrated in FIG. 2. Source line 112 may be deposited using a spin-on deposition from slurry, sputtering, CVD, or any combination, or some other form of deposition that can deposit source line 112 on n-type semiconducting layer 114. In an example, bit line recess 140 and source line recess 142 may be created during the same process. Also, bit line 108 and source line 112 may be deposited in the same process. In another example, bit line 108 and source line 112 can be planarized to the top of first gate 110.

Figure 7:
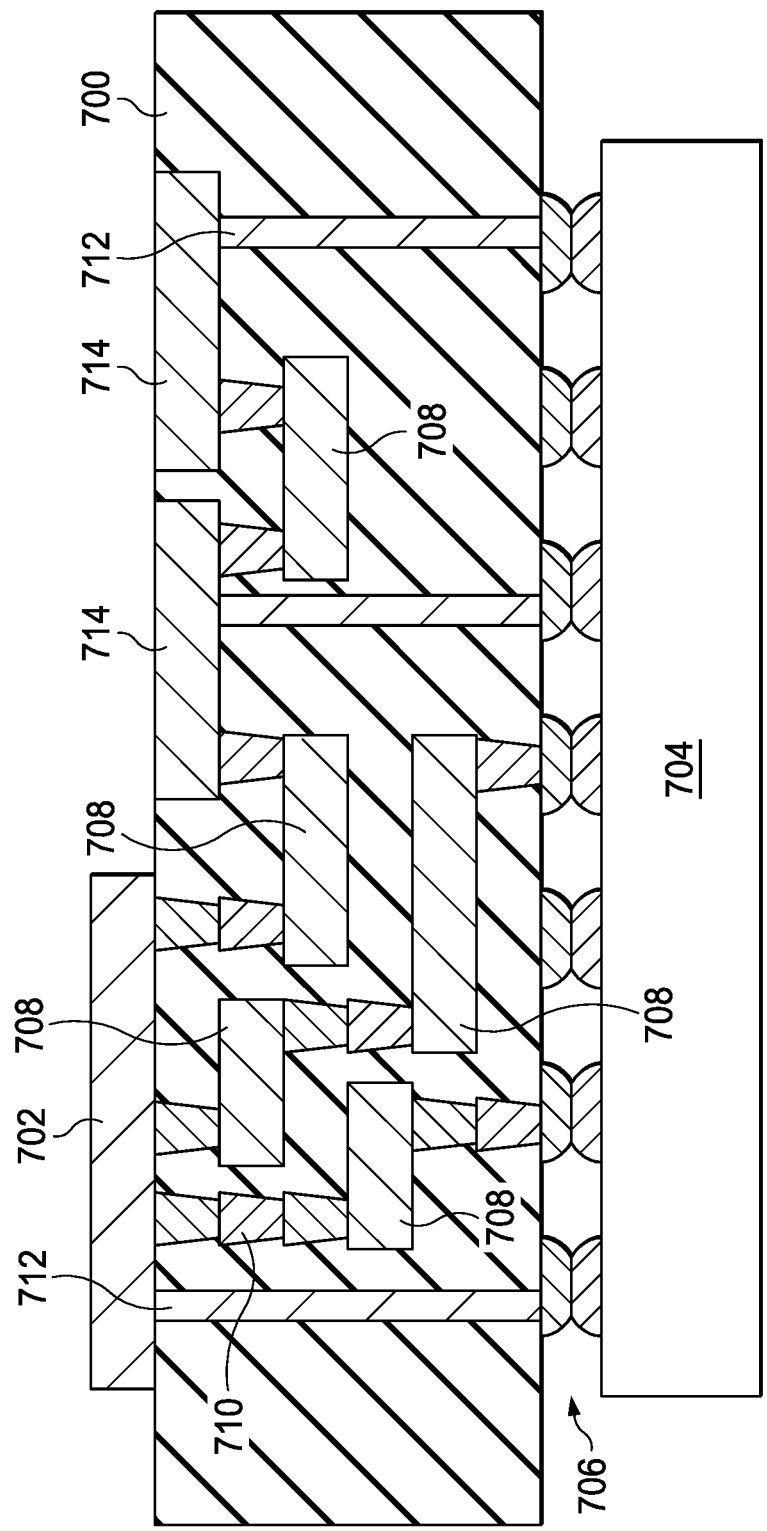
FIG. 7 is an interposer implementing one or more of the embodiments disclosed herein.

Turning to FIG. 7, FIG. 7 illustrates an interposer 700 that can include or interact with one or more embodiments disclosed herein. The interposer 700 is an intervening substrate used to bridge a first substrate 702 to a second substrate 704. The first substrate 702 may be, for instance, an integrated circuit die. The second substrate 704 may be, for instance, a memory module, a computer motherboard, or another integrated circuit die. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700. In accordance with various embodiments, apparatuses or processes disclosed herein may be used in the fabrication of interposer 700.

Figure 8:
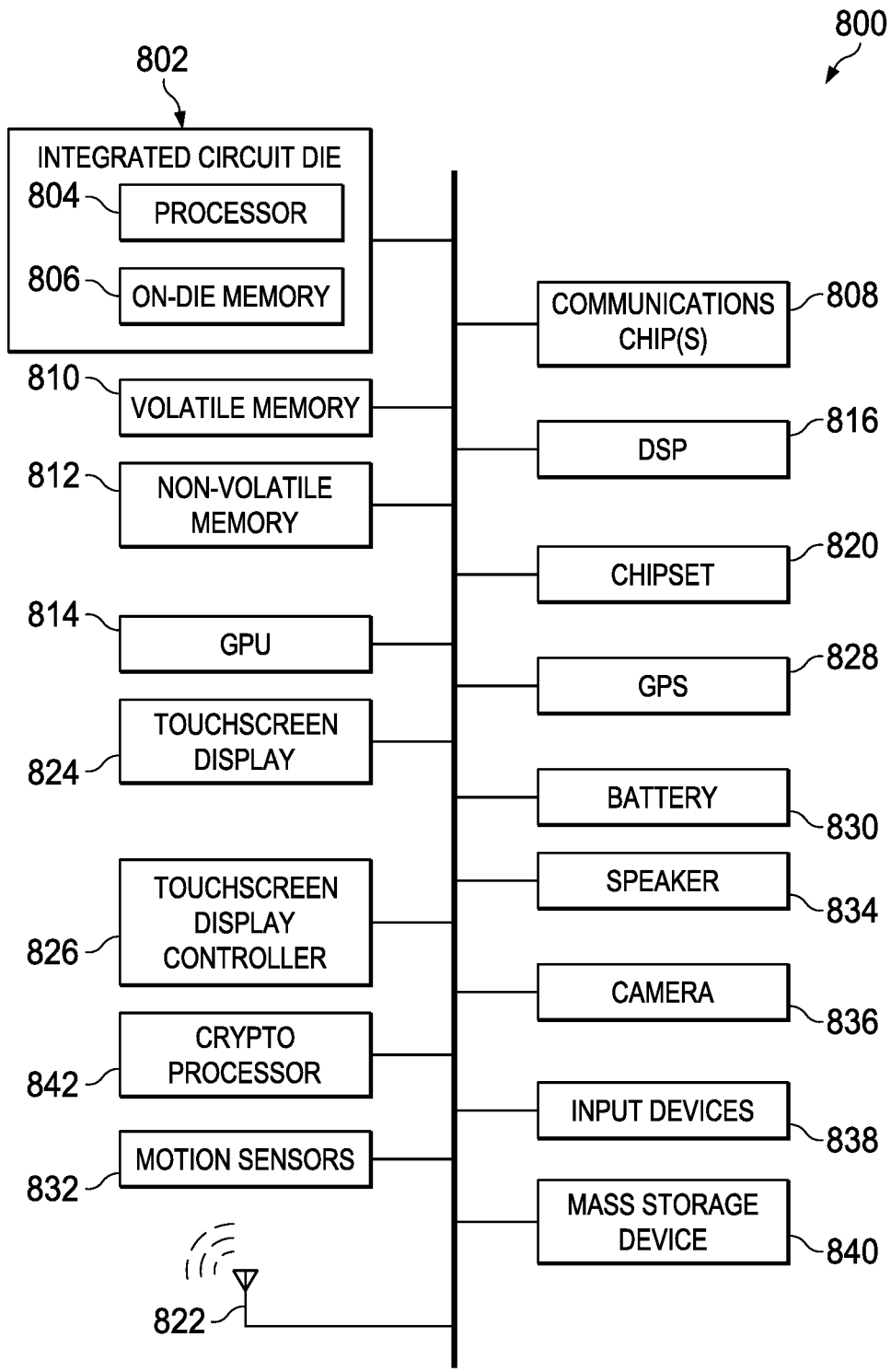
FIG. 8 is a computing device built in accordance with an embodiment disclosed herein.

Turning to FIG. 8, FIG. 8 illustrates a computing device 800 in accordance with various embodiments. The computing device 800 may include a number of components. In one embodiment, these components are attached to one or more motherboards. In an alternate embodiment, some or all of these components are fabricated onto a single system-on-a-chip (SoC) die. The components in the computing device 800 include, but are not limited to, an integrated circuit die 802 and at least one communications logic unit 808. In some implementations the communications logic unit 808 is fabricated within the integrated circuit die 802 while in other implementations the communications logic unit 808 is fabricated in a separate integrated circuit chip that may be bonded to a substrate or motherboard that is shared with or electronically coupled to the integrated circuit die 802. The integrated circuit die 802 may include a CPU 804 as well as on-die memory 806, often used as cache memory, that can be provided by technologies such as embedded DRAM (eDRAM) or spin-transfer torque memory (SUM or STT-MRAM).

Computing device 800 may include other components that may or may not be physically and electrically coupled to the motherboard or fabricated within an SoC die. These other components include, but are not limited to, volatile memory 810 (e.g., DRAM), non-volatile memory 812 (e.g., ROM or flash memory), a graphics processing unit 814 (GPU), a digital signal processor 816, a crypto processor 842 (a specialized processor that executes cryptographic algorithms within hardware), a chipset 820, an antenna 822, a display or a touchscreen display 824, a touchscreen controller 826, a battery 828 or other power source, a power amplifier (not shown), a voltage regulator (not shown), a global positioning system (GPS) device 828, a compass 830, a motion coprocessor or sensors 832 (that may include an accelerometer, a gyroscope, and a compass), a speaker 834, a camera 836, user input devices 838 (such as a keyboard, mouse, stylus, and touchpad), and a mass storage device 840 (such as hard disk drive, compact disk (CD), digital versatile disk (DVD), and so forth).

The communications logic unit 808 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 808 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communications logic units 808. For instance, a first communications logic unit 808 may be dedicated to shorter range wireless communications such as Wi-Fi and Bluetooth and a second communications logic unit 808 may be dedicated to longer range wireless communications such as GPS, EDGE, GPRS, CDMA, WiMAX, LTE, Ev-DO, and others.

The processor 804 of the computing device 800 can communicate with one or more devices that are formed in accordance with various embodiments. The term "processor" may refer to any device or portion of a device that processes electronic data from registers and/or memory to transform that electronic data into other electronic data that may be stored in registers and/or memory.

The communications logic unit 808 may also include one or more devices, such as transistors or metal interconnects, that are in communication with various ones of the embodiments disclosed herein. In further embodiments, another component housed within the computing device 800 may contain one or more devices, such as transistors or metal interconnects, that are formed in accordance with implementations of the embodiments disclosed herein.

In various embodiments, the computing device 800 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

The above description of illustrated implementations, including what is described in the Abstract, is not intended to be exhaustive or to limit the scope of the disclosure to the precise forms disclosed. While specific implementations of, and examples for, the embodiments disclosed herein are described herein for illustrative purposes, various equivalent modifications are possible within the scope of the disclosure, as those skilled in the relevant art will recognize.

Other Notes and Examples

Example 1 is an apparatus including a transmission gate, where the transmission gate includes an n-type back end transistor and a p-type back end transistor in parallel with the n-type back end transistor.

In Example 2, the subject matter of Example 1 can optionally include where the transmission gate is on a non-silicon substrate.

In Example 3, the subject matter of any one of Examples 1 and 2 can optionally include where the transmission gate is over a logic element.

In Example 4, the subject matter of any one of Examples 1-3 can optionally include where the transmission gate includes a second gate, a p-type semiconducting layer over the second gate, an n-type semiconducting layer over the p-type semiconducting layer, a bit line over the n-type semiconducting layer, a first gate over the n-type semiconducting layer, and a source line over the n-type semiconducting layer.

In Example 5, the subject matter of any one of Examples 1-4 can optionally include where a dielectric is between the second gate and the p-type semiconducting layer.

In Example 6, the subject matter of any one of Examples 1-5 can optionally include where a dielectric insulates the first gate from the bit line, source line, and the n-type semiconducting layer.

In Example 7, the subject matter of any one of Examples 1-6 can optionally include where the transmission gate is coupled to a memory element.

In Example 8, the subject matter of any one of Examples 1-7 can optionally include where the memory element is resistive random access memory (RRAM).

In Example 9, a method can include depositing a p-type semiconducting layer over a second gate, depositing an n-type semiconducting layer over the p-type semiconducting layer, depositing a bit line over the n-type semiconducting layer, depositing a first gate over the n-type semiconducting layer, and depositing a source line over the n-type semiconducting layer to create a transmission gate.

In Example 10, the subject matter of Example 9 can optionally include where the transmission gate is on a non-silicon substrate.

In Example 11, the subject matter of any one of Examples 9 and 10 can optionally include where the transmission gate is over a logic element.

In Example 12, the subject matter of any one of Examples 9-11 can optionally include where the n-type semiconducting layer, the bit line, the first gate, and the source line comprise an n-type back end transistor and the p-type semiconducting layer, the bit line, the second gate, and the source line comprise an p-type back end transistor.

In Example 13, the subject matter of any one of Examples 9-12 can optionally include where a dielectric insulates the first gate from the bit line, source line, and the n-type semiconducting layer.

In Example 14, the subject matter of any one of Examples 9-13 can optionally include where the transmission gate is coupled to a memory element.

In Example 15, the subject matter of any one of Examples 9-14 can optionally include where the memory element is resistive random access memory (RRAM).

Example 16 is a computing device including a processor mounted on a substrate, a communications logic unit within the processor, a memory within the processor, a graphics processing unit within the computing device, an antenna within the computing device, a display on the computing device, a battery within the computing device, a power amplifier within the processor, and a voltage regulator within the processor. The memory can be coupled to a transmission gate and the transmission gate includes an n-type back end transistor and a p-type back end transistor in parallel with the n-type back end transistor.

In Example 17 the subject matter of Example 16 can optionally include where the transmission gate is on a non-silicon substrate.

In Example 18 the subject matter of any one of Examples 16 and 17 can optionally include where the transmission gate is over a logic element.

In Example 19, the subject matter of any one of Examples 16-18 can optionally include where the transmission gate includes a second gate, a p-type semiconducting layer over the second gate, an n-type semiconducting layer over the p-type semiconducting layer, a bit line over the n-type semiconducting layer, a first gate over the n-type semiconducting layer, and a source line over the n-type semiconducting layer.

In Example 20, the subject matter of any one of the Examples 15-19 can optionally include where the memory element is resistive random access memory (RRAM).

Example 21 is an integrated circuit (IC) assembly including a non silicon substrate, a transmission gate on top of the non-silicon substrate, where the transmission gate includes an n-type back end transistor and a p-type back end transistor in parallel with the n-type back end transistor.

In Example 22, the subject matter of Example 21 can optionally include where the transmission gate is over a logic element.

In Example 23, the subject matter of any one of the Examples 21 and 22-23 can optionally include where the transmission gate includes a second gate, a p-type semiconducting layer over the second gate, an n-type semiconducting layer over the p-type semiconducting layer, a bit line over the n-type semiconducting layer, a first gate over the n-type semiconducting layer, and a source line over the n-type semiconducting layer.

In Example 24, the subject matter of any one of the Examples 21-23 can optionally include where the transmission gate is coupled to a memory element.

In Example 25, the subject matter of any one of the Examples 22-24 can optionally include where the memory element is resistive random access memory (RRAM).

The invention claimed is:

1. An apparatus, comprising:
  a transmission gate, wherein the transmission gate includes:
  an n-type back-end transistor; and
  a p-type back-end transistor in parallel with the n-type back-end transistor.

2. The apparatus of claim 1, wherein the transmission gate is on a non-silicon substrate.

3. The apparatus of claim 2, wherein the transmission gate is over a logic element.

4. The apparatus of claim 1, wherein the transmission gate includes:
  a second gate;
  a p-type semiconducting layer over the second gate;
  an n-type semiconducting layer over the p-type semiconducting layer;
  a bit line over the n-type semiconducting layer;
  a first gate over the n-type semiconducting layer; and
  a source line over the n-type semiconducting layer.

5. The apparatus of claim 4, wherein a dielectric is between the second gate and the p-type semiconducting layer.

6. The apparatus of claim 4, wherein a dielectric insulates the first gate from the bit line, source line, and the n-type semiconducting layer.

7. The apparatus of claim 1, wherein the transmission gate is coupled to a memory element.

8. The apparatus of claim 7, wherein the memory element is resistive random access memory (RRAM).

9. A computing device, comprising:
  a memory device including a memory element coupled to a transmission gate, wherein the transmission gate includes:
  an n-type back-end transistor; and
  a p-type back-end transistor in parallel with the n-type back-end transistor.

10. The computing device of claim 9, wherein the transmission gate is on a non-silicon substrate.

11. The computing device of claim 9, wherein the transmission gate is over a logic element.

12. The computing device of claim 9, wherein the transmission gate includes:
a second gate;
a p-type semiconducting layer over the second gate;
an n-type semiconducting layer over the p-type semiconducting layer;
a bit line over the n-type semiconducting layer;
a first gate over the n-type semiconducting layer; and
a source line over the n-type semiconducting layer.

13. The computing device of claim 9, wherein the memory element is resistive random access memory (RRAM).

14. An integrated circuit (IC) die, comprising:
a non-silicon substrate;
a transmission gate on top of the non-silicon substrate, wherein the transmission gate includes:
an n-type back-end transistor; and
a p-type back-end transistor in parallel with the n-type back-end transistor.

15. The IC die of claim 14, wherein the transmission gate is over a logic element.

16. The IC die of claim 14, wherein the transmission gate includes:
a second gate;
a p-type semiconducting layer over the second gate;
an n-type semiconducting layer over the p-type semiconducting layer;
a bit line over the n-type semiconducting layer;
a first gate over the n-type semiconducting layer; and
a source line over the n-type semiconducting layer.

17. The IC die of claim 14, wherein the transmission gate is coupled to a memory element.

18. The IC die of claim 17, wherein the memory element is resistive random access memory (RRAM).

* * * * *